(12) United States Patent
Bashaboina et al.

(10) Patent No.: US 8,347,259 B1
(45) Date of Patent: Jan. 1, 2013

(54) CIRCUIT ENHANCEMENT BY MULTIPLICATE-LAYER-HANDLING CIRCUIT SIMULATION

(75) Inventors: Pavan Y. Bashaboina, Hyderabad (IN); James A. Culp, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/193,721

(22) Filed: Jul. 29, 2011

(51) Int. Cl.
  *G06F 17/50* (2006.01)
(52) U.S. Cl. ...................................................... 716/132
(58) Field of Classification Search .................. 716/132
  See application file for complete search history.

(56) References Cited

U.S. PATENT DOCUMENTS

| | | | |
|---|---|---|---|
| 6,301,690 | B1 | 10/2001 | Ditlow et al. |
| 7,154,791 | B2 | 12/2006 | Kim |
| 8,141,016 | B2 * | 3/2012 | Correale et al. ............... 716/111 |
| 2004/0230922 | A1 * | 11/2004 | Allen et al. ....................... 716/2 |
| 2010/0058260 | A1 * | 3/2010 | Correale et al. .................. 716/5 |
| 2012/0084745 | A1 * | 4/2012 | Liu et al. ........................ 716/127 |

OTHER PUBLICATIONS

Kahng, A.B., "Lithography and Design in Partnership: A New Roadmap" Proc. SPIE Advanced Lithography Symposium (Feb. 25, 2008) 10 pp., vol. 7122.
Jess, J.A.G. et al., "Statistical Timing for Parametric Yield Prediction of Digital Integrated Circuits" Design Automation Conference (DAC) (Jun. 2-6, 2003) pp. 932-937.
Alam, S.M. et al., "Circuit Level Reliability Analysis of Cu Interconnects" IEEE Explore, 5th International Symposium on Quality Electronic Design (Aug. 24, 2004) pp. 238-243.

* cited by examiner

*Primary Examiner* — Suchin Parihar
(74) *Attorney, Agent, or Firm* — Scully, Scott, Murphy & Presser, P.C.; Yuanmin Cai (57) ABSTRACT

Critical circuit blocks are identified in a chip design layout, and are marked by a marker layer identifying a marked region. Multiplicate layers are generated for each critical circuit block within each marked region. Each multiplicate layer includes a different type of variant for each identified critical circuit block. The different types of variants correspond to different types of optimization goals to address different issues in circuit performance. Circuit simulation is performed with each type of variants in combination with adjacent circuit blocks as provided in original design. In each marked region, the results of the circuit simulations are evaluated to determine an optimal type among the variants. The optimal type is retained in each marked region, thereby providing a chip design layout in which various marked regions can include different types of variant circuit blocks to provide local circuit optimization.

25 Claims, 5 Drawing Sheets

CIRCUIT ENHANCEMENT BY MULTIPLICATE-LAYER-HANDLING CIRCUIT SIMULATION

BACKGROUND

The present disclosure relates to methods and systems for semiconductor manufacturing, and particularly to methods and systems for enhancing circuit performance, yield, and/or performance reliability of a semiconductor chip by employing multiplicate-layer-handling circuit simulation.

With continual scaling of dimensions in semiconductor devices and increase in the number of gates per chip, increasing yield and performance and circuit reliability of semiconductor chips has become a challenge for advanced semiconductor devices. Circuit simulation and reliability simulation of a chip design layout prior to manufacturing is extensively employed to maximize yield and performance of advanced semiconductor chips. As known in the art, the same type of device is employed throughout a semiconductor chip without any modification based on any particular concern.

Regarding circuit performance, a block in a semiconductor chip is designed according to a general design guideline without particular emphasis on performance or timing. During circuit simulations, a compromise is made to find operating conditions at which both power consumption and signal delay are maintained at acceptable levels. The frequency of chip operation can be reduced in order to bring about closure on power consumption and signal delay at all corners of operating conditions. The resulting design is a compromise between power consumption requirements and timing requirements.

Regarding circuit reliability, identical transistors are used to perform identical functions throughout a semiconductor chip. However, the environment in which these transistors are placed differs from transistor to transistor. The circuit reliability of each transistor is affected by different circuit reliability issues, which include, but are not limited to, thermal stress, operating temperature, electromigration, and pattern sensitivities. Such circuit reliability issues can be on a length scale of more than one chip block within a semiconductor chip. Thus, not all circuit reliability issues can be predicted before all blocks are placed in a design for a semiconductor chip. Variability in circuit reliability across a semiconductor chip has been taken as granted, and semiconductor chips have been designed with the expectation that some of the semiconductor devices would statistically fail. However, such an approach ultimately results in circuit reliability levels that are subject to random statistical variation depending on the types of environments that the semiconductor devices are subjected to due to arbitrariness in the design of the semiconductor chip.

BRIEF SUMMARY

Critical circuit blocks are identified in a chip design layout, and are marked by a marker layer identifying a marked region. Multiplicate layers are generated for each critical circuit block within each marked region. Each multiplicate layer includes a different type of variant for each identified critical circuit block. The different types of variants correspond to different types of optimization goals to address different issues in circuit performance. Circuit simulation is performed with each type of variants in combination with adjacent circuit blocks as provided in original design. In each marked region, the results of the circuit simulations are evaluated to determine an optimal type among the variants. The optimal type is retained in each marked region, thereby providing a chip design layout in which various marked regions can include different types of variant circuit blocks to provide local circuit optimization.

According to an aspect of the present disclosure, a method for modifying a chip design layout is provided. The method includes: marking, in a chip design layout, regions associated with an instance of a circuit block with marker layers; adding multiplicate circuits to each instance of the circuit block in the marker layers in the chip design layout; performing circuit simulations for each marker layer in the chip design layout by running a circuit simulation program having multiplicate layer handling capability, wherein each of the multiplicate circuits is successively employed to perform circuit simulations for each instance of the circuit block in the marker layers; calculating a circuit metric for each of the circuit simulations; generating a modified chip design layout by selecting, for each marker layer, a multiplicate circuit that maximizes the circuit metric; and storing data representing the modified chip design layout in a non-transitory machine readable storage medium by encoding the data therein.

According to another aspect of the present disclosure, a system for modifying a chip design layout is provided. The system includes at least one computing means and a non-transitory machine readable storage medium. The at least one computing means is configured to perform the steps of: marking, in a chip design layout, regions associated with an instance of a circuit block with marker layers; adding multiplicate circuits to each instance of the circuit block in the marker layers in the chip design layout; performing circuit simulations for each marker layer in the chip design layout by running a circuit simulation program having multiplicate layer handling capability, wherein each of the multiplicate circuits is successively employed to perform circuit simulations for each instance of the circuit block in the marker layers; calculating a circuit metric for each of the circuit simulations; generating a modified chip design layout by selecting, for each marker layer, a multiplicate circuit that maximizes the circuit metric; and storing data representing the modified chip design layout in a non-transitory machine readable storage medium by encoding the data therein.

DETAILED DESCRIPTION

As stated above, the present disclosure relates to methods and systems for enhancing circuit performance, yield, and/or performance reliability of a semiconductor chip by employing multiplicate-layer-handling circuit simulation, which are now described in detail with accompanying figures. Like and corresponding elements are referred to by like reference numerals. The drawings are not necessarily drawn to scale.

As used herein, a "unit circuit" is a unit semiconductor device or a unit optical device as known in the art. A unit circuit can be a transistor, a diode, a capacitor, a resistor, a varactor, or any other semiconductor device or optical device known in the art.

As used herein, a "circuit block" is a set of at least one unit circuit.

As used herein, "circuit performance" refers to performance of a circuit in terms of power consumption and timing.

As used herein, "yield" refers to the ratio of functional chips to all manufactured chips in a manufacturing process.

As used herein, "circuit reliability" refers to the capability of a circuit to provide circuit reliability performance at a target level irrespective of environmental variables that may affect the circuit reliability performance. Circuit reliability includes the stability of circuit performance as a function of any external variables that affect the operation of a semiconductor chip, as a function of passage of time, or as a function of use during operation of a semiconductor chip over the course of its lifetime. External variables include variations in at least one supply voltage, electrical noise, ambient gas, humidity, ambient temperature, or any other physical variable that affects the circuit performance during usage of a semiconductor chip.

As used herein, a "circuit issue" refers to any or all of circuit performance, yield, and circuit reliability.

As used herein, "circuit performance" is performance of a circuit with respect to all circuit issues.

As used herein, a "circuit metric" refers to any metric that measure at least one of the circuit issues.

As used herein, a "critical functionality" refers to a functionality that affects the overall performance of a semiconductor device in a measurable way in terms of circuit performance, yield, and/or performance reliability.

As used herein, a "critical circuit block" is a circuit block in which at least one of the circuit issues is a critical functionality that has not been proven to be within design specification for that unit circuit by any means verifying conformity with the design specification as known in the art (including simulation and experiments).

As used herein, "circuit simulation" refers to any simulation that calculates any circuit metric.

As used herein, a "design shape" includes one or more unit design shapes that define a unit component of a semiconductor device, a sub-unit of a unit component of a semiconductor device, a plurality of components of a semiconductor device, a single semiconductor device, a plurality of semiconductor devices, or a set of semiconductor devices that constitutes a circuit.

Figure 1:
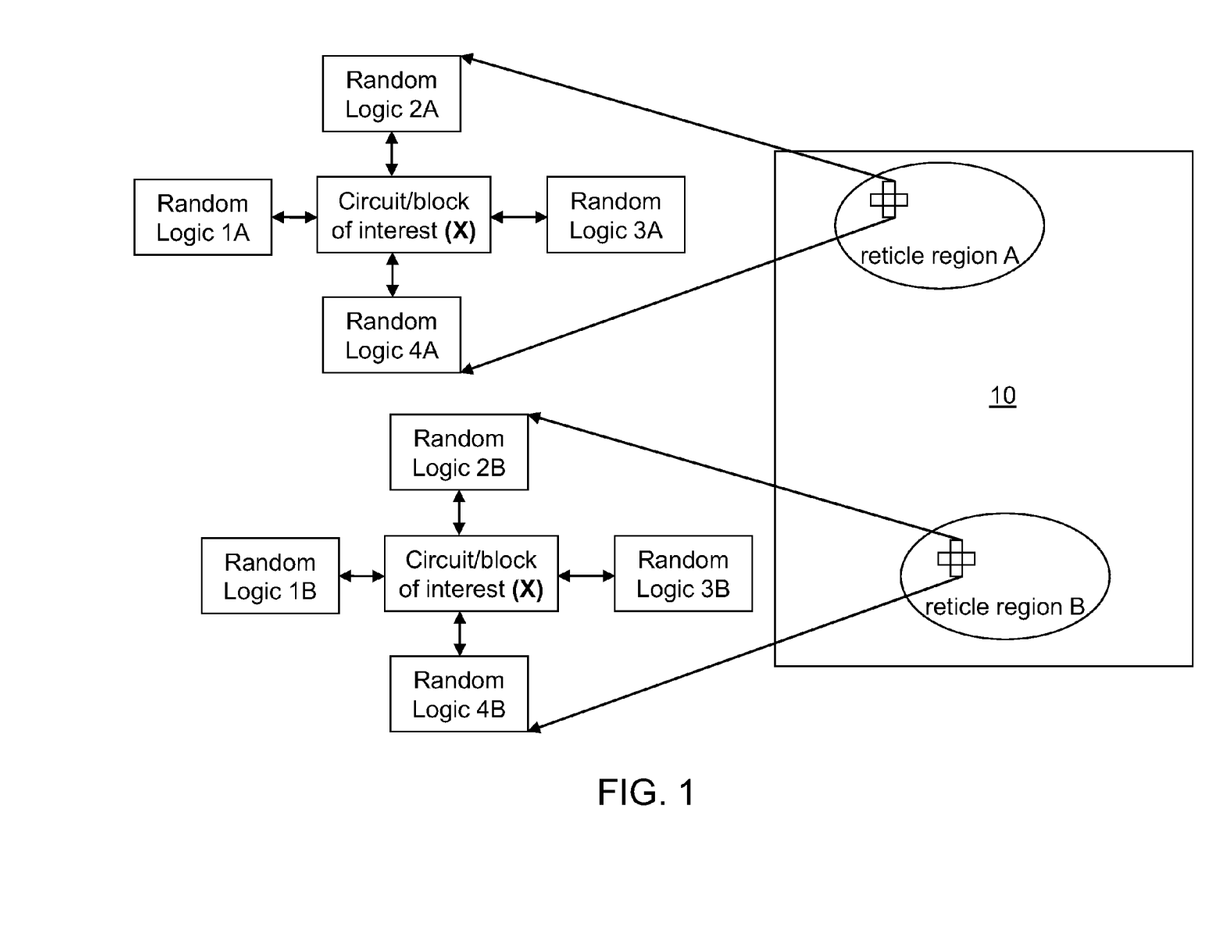
FIG. 1 is a diagram illustrating different environments for critical circuit blocks.

FIG. 1 is a diagram illustrating different environments for a pair of identical circuit blocks labeled "X" that are placed in two different circuit environments in a reticle 10, i.e., a lithographic mask. A first instance of the circuit block X is placed in a region of a reticle labeled "reticle region A," and a second instance of the circuit block X is placed in a region of the reticle labeled "reticle region B."

Once a full reticle is assembled by placing all required circuit blocks therein, electrical analysis can be performed on the entirety of the reticle, which is typically referred to as reticle analysis. Various regions can be identified as critical regions in which at least one performance metric does not fully meet predefined specification. Each critical region can be classified for the type of performance metric that is not met. For example, a critical region may be a power critical region in which power consumption metric does not meet the specification, or a timing critical region in which timing requirements do not meet the specification. Many other types of critical regions may be defined depending on the nature of the shortfall in performance metrics.

For example, electrical analysis on two circuit blocks X in FIG. 1 may show that performance requirements on the two circuit blocks X are different. For example, the first instance of the circuit block X may be in a power critical region in which conservation of power is the most important factor for improving circuit performance, while the second instance of the circuit block X may be in a timing critical region in which device operation at a fast switching speed irrespective of power consumption is the most important factor for improving circuit performance. The methods of the present disclosure can be employed to optimize each instance of the circuit block X in different ways to enhance overall performance of the circuits in the different reticle regions. For example, the first instance of the circuit block X can be modified to enhance power performance, i.e., to reduce power consumption therein, and the second instance of the circuit block X can be modified to enhance the switching speed, thereby enhancing performance in timing. The method of the present disclosure is particularly useful where the circuit block X is a critical circuit block, i.e., when it has not been verified whether the circuit block X satisfies design specification under all circumstances and operating conditions.

Figure 2:
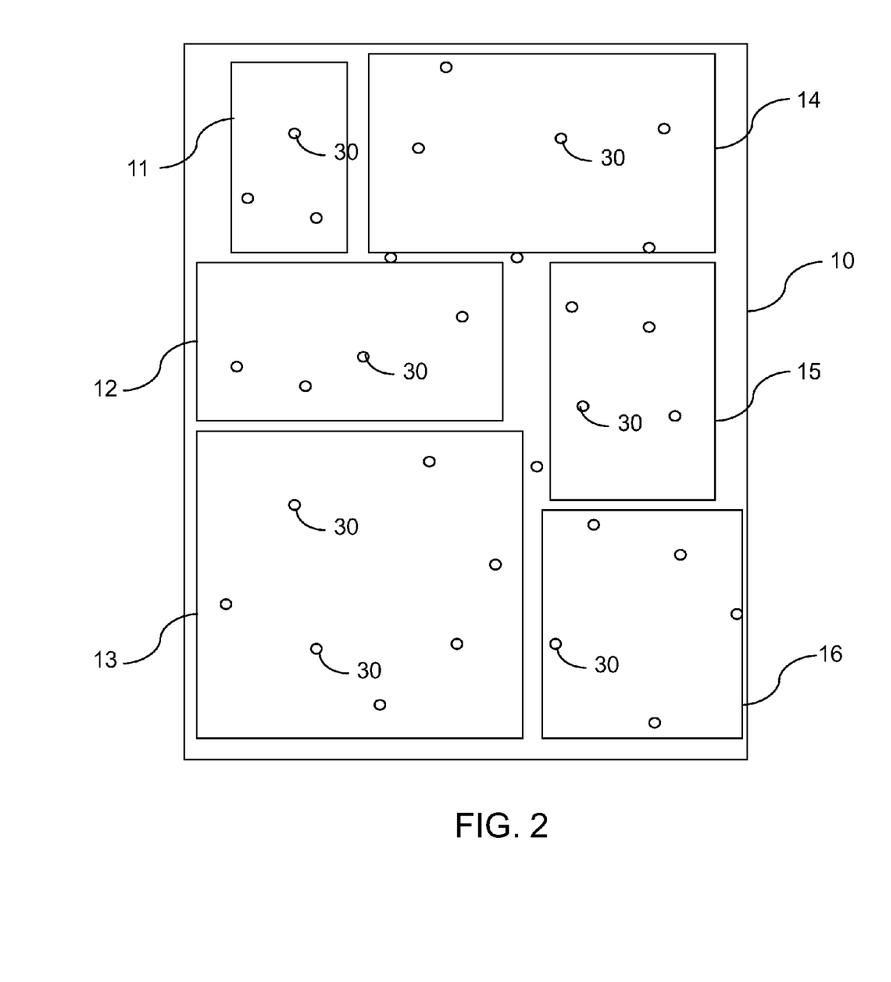
FIG. 2 is a diagram illustrating different environments for critical circuit blocks of a same type that are marked with a marker layer.

FIG. 2 is a diagram illustrating different environments for critical circuit blocks of a same type that are marked with a marker layer on a reticle 10. The reticle 10 includes various chiplet regions, which includes, for example, a first chiplet region 11, a second chiplet region 12, a third chiplet region 13, a fourth chiplet region 14, a fifth chiplet region 15, and a sixth chiplet region 16. Sensitive device circuits 30 are spread across the reticle. The sensitive device circuits 30 are semiconductor circuits including at least one semiconductor device. The at least one semiconductor device can be one or more of a field effect transistor, a bipolar transistor, a diode, a resistor, a capacitor, an inductor, a varactor, any nanoscale device, any optical device, or any combination thereof. Some sensitive device circuits may be placed with chiplet regions (11-16), and some sensitive device circuits may be placed between chiplet regions (11-16). The sensitive device circuits 30 are required to provide identical function and performance irrespective of placement within the reticle 10 and the circuit environments at each location. In other words, the sensitive device circuits 30 are required to deliver zero or minimal across-chip-variation (ACV) on the reticle 10.

In an initial chip design layout, an identical circuit block is employed for each of the sensitive device circuits 30. Variability in circuit reliability is introduced, however, across the reticle 10 due to many types of environmental variables, i.e., locally-varying parameters that affect circuit reliability of the physical components on a semiconductor chip corresponding to the sensitive device circuits 30. For example, the locally-varying parameters that affect circuit reliability of the physical components include, but are not limited to, thermal stress, operating temperature, electromigration, and pattern sensitivities in processing steps. Pattern sensitivities in processing steps can introduce non-uniform deposition, etching, or planarization during the manufacture of the semiconductor chip. Because some of the circuit reliability issues are affected by features of the chip design layout that are spread across a large length scale on par with the dimensions of manufactured semiconductor chips, predicting the circuit reliability of individual instances of the sensitive device circuits 30 is difficult before the reticle 10 is built at design level, i.e., before the contents of the reticle 10 are completely filled in a completed chip design layout.

In an embodiment of the present disclosure, critical circuit blocks are identified in a chip design layout. In one embodiment, the critical circuit blocks can be, for example, the sensitive device circuits 30 in the reticle 10, which are required to provide identical function and performance irrespective of placement within the reticle. In some embodiments, the critical circuit blocks can be circuit blocks that are required to provide performance above a predefined performance level irrespective of placement within a reticle or any other environmental parameters.

Critical circuit blocks are provided with an overlapping circuit blocks, which are herein referred to as multiplicate circuits. Each multiplicate circuit is a circuit block that is optimized to enhance at least one circuit reliability issues. Circuit reliability simulation tools employing multiplicate-layer-handling circuit reliability simulation can be utilized to select one of the multiplicate circuits associated with each critical circuit block such that the selected multiplicate circuit scores a maximum in circuit reliability performance metrics. Each instance of the critical circuit blocks can thus be replaced with one of the multiplicate circuits to address any circuit reliability concern that is discovered during the circuit reliability simulation.

Figure 3:
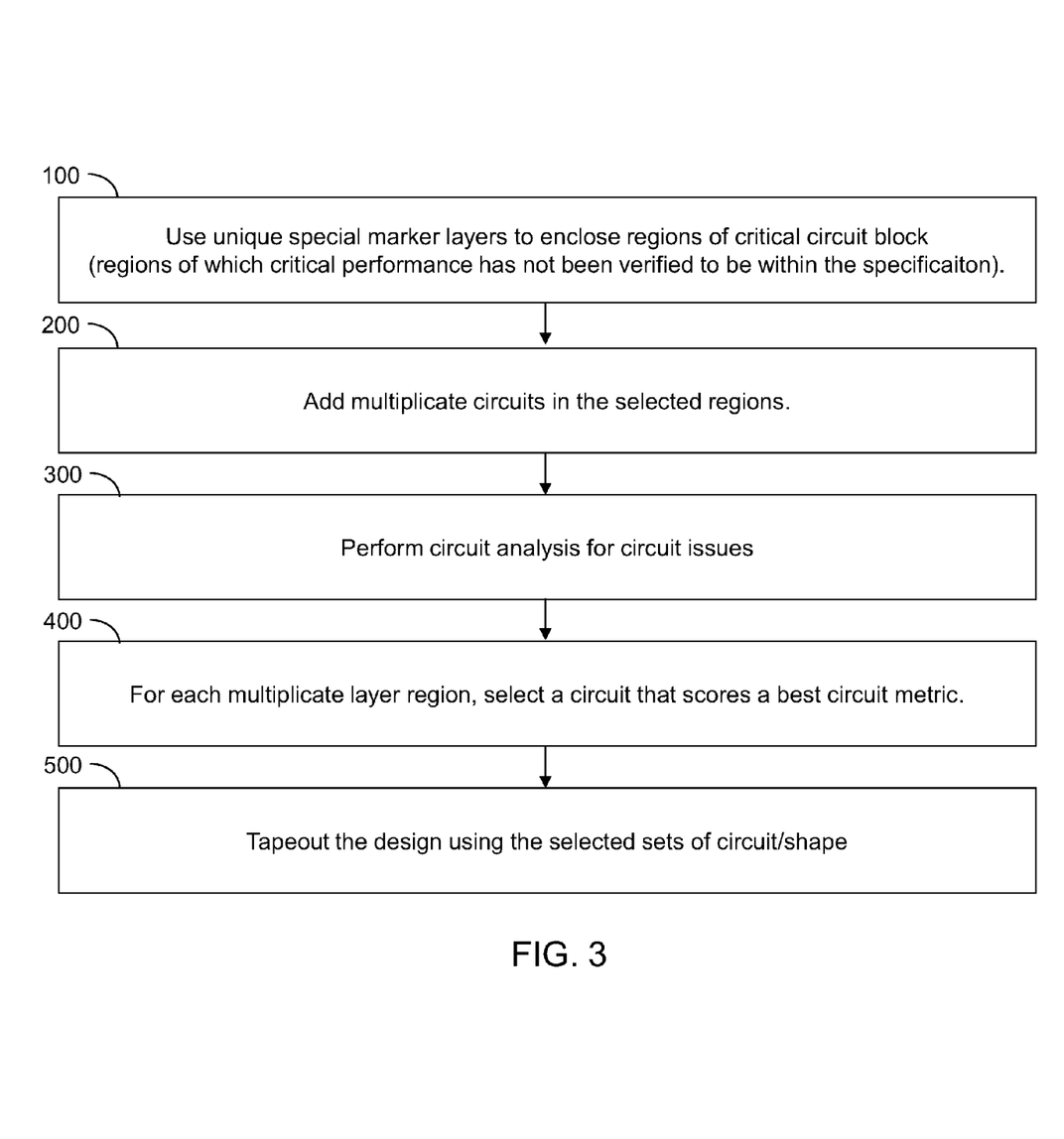
FIG. 3 is a flow chart illustrating a method of optimizing a chip design layout employing multiplicate-layer-handling circuit simulation according to an embodiment of the present disclosure.

Referring to FIG. 3, general methods of the present disclosure are illustrated in a flow chart. The flow chart illustrates a method of optimizing a chip design layout employing multiplicate-layer-handling circuit simulation. A modified chip design layout is generated by individualized enhancement of a necessary aspect of correction to circuit performance on each circuit block in a chip design layout by replacing the circuit block with one of multiplicate circuits that addresses a deficiency in an aspect of circuit performance.

The modified chip design layout incorporating individualized enhancement of circuit performance can lead to enhancement in product performance, product reliability, yield, and/or turn-around-time (TAT) of semiconductor chips that are manufactured employing the modified chip design layout. Further, this method can also be employed to manufacture a set of at least one reticle that incorporates the modified chip design layout, in which the original chip design layout is modified employing multiplicate-layer-handling circuit simulation.

Referring to step 100, a chip design layout including at least one design level is provided. Each of the at least one design level can represent a lithographic level employed in a manufacturing sequence for manufacturing semiconductor chips embodying the design in the chip design layout, which is herein referred to as an original chip design layout. The original chip design layout can include multiple types of circuit blocks. Each type of circuit block can have an identical design in the original chip design layout.

Each type of circuit block includes at least one semiconductor device and may include at least one wiring structure connected to the at least one semiconductor device. The at least one semiconductor device can include, but is not limited to, field effect transistors, bipolar transistors, diodes, resistors, capacitors, inductors, varactors, and any other nanoscale device and/or optical devices known in the art. Further, each type of circuit block may include a plurality of semiconductor devices that collectively constitute an electrical circuit configured to perform a predefined task such as mathematical manipulations and/or logical manipulation and/or data storage. Each type of circuit block may include multiple semiconductor devices that range in number from 2 to 1,000,000, although even greater number of semiconductor devices can also be present in one type of circuit block.

In the original chip design layout, at least one instance of a circuit block is provided. A set of at least one circuit block that is known to be associated with at least one potential circuit issue are identified in the chip design layout. If a region includes a circuit block known to be associated with at least one potential circuit issue, such a circuit block is a critical circuit block. A corresponding region including the critical circuit block is referred to as a critical region. A critical region can be an electrical performance challenged region in which electrical performance parameters has not been verified to fall within specification irrespective or circuit environments. Further, a critical region can be a circuit reliability challenged region in which circuit reliability has not been verified to fall within specification irrespective or circuit environments. The critical circuit blocks can be identified with an automated program or by manual identification.

In one embodiment, the critical circuit blocks in the chip design layout can be identified employing an automated program that analyzes electrical characteristics of neighboring circuits around each instance of the circuit block in the chip design layout. In another embodiment, the automated program may be in communication with a database that stores data for a set of circuit blocks that have been verified to provide electrical performance and/or circuit reliability parameters within a predefined specification irrespective of circuit environments. If any circuit block does not match a circuit block in the set of circuit blocks, such a circuit block can be identified as a critical circuit block.

Once a set of critical circuit blocks in a chip design layout is identified, each corresponding critical region is marked with a marker layer. Thus, a first modified chip design layout is generated from the original chip design layout by adding marker layers that enclose each critical region in the original chip design layout. In one embodiment, the critical regions can be identified in the chip design layout employing an automated program that analyzes electrical characteristics of neighboring circuits around each instance of all circuit blocks in the chip design layout.

Referring to step 200, for each critical region, multiplicate circuits are added to each instance of the circuit block in the marker layers in the chip design layout. Each set of multiplicate circuits added to a circuit block is a set of different circuit blocks.

In one embodiment, each of the multiplicate circuits represents a variant circuit block, i.e., an alternate design, for the circuit block. Each variant circuit block can include at least one modification to the circuit block that can enhance electrical performance, yield, and/or circuit reliability in one aspect. The circuit block as originally present in the chip design layout before addition of the multiplicate circuits is referred to as the "original" circuit block to be distinguished from the circuit blocks of the multiplicate circuits.

In another embodiment, one of the multiplicate circuits may be identical to the original circuit block. In this embodiment, the set of multiplicate circuits includes one original circuit block and at least one variant circuit block.

To generate a variant circuit block, a circuit block may be modified to a degree that is sufficient to affect circuit performance, yield, and/or circuit reliability. Thus, the multiplicate circuits differ among one another in at least one design shape. Specifically, a set of at least one design shape is modified to provide such a change in circuit performance, yield, and/or circuit reliability. In some embodiments, semiconductor components and/or semiconductor devices may be added to, or removed from, the design for the circuit block to generate variant circuit blocks.

In one embodiment, each of the multiplicate circuits can perform a same set of electrical functions with a variation in performance. Exemplary variations include, but are not limited to, total power consumption, total leakage current, and a delay time for at least one signal.

In one embodiment, each of the multiplicate circuits can be configured to perform a same set of electrical functions at the same performance level under a set of different environmental conditions that a physical structure embodying the circuit block is subjected to during operation of a semiconductor chip including the physical structure. The set of different environments includes, but are not limited to, at least one of different operating temperatures, different thermal stress, different power supply voltage, and different pattern density in surrounding circuits.

In one embodiment, the multiplicate circuits can be configured to perform a same set of electrical functions with a same electrical performance metric under a set of different environments. For example, the set of different environments can include at least one of different ambient temperatures, different power supply voltages, and different leakage current.

In one embodiment, the multiplicate circuits can be configured to perform a same set of electrical functions with the same circuit reliability metric under a set of different environmental conditions. The same circuit reliability metric can include, but is not limited to, estimated nominal on-current, estimated nominal off-current, estimated nominal leakage current, estimated nominal supply voltage droop, estimated nominal input impedance, estimated nominal output impedance, estimated nominal impedance of a component, estimated nominal signal delay, estimated maximum on-current, estimated maximum off-current, estimated maximum leakage current, estimated maximum supply voltage droop, estimated maximum input impedance, estimated maximum output impedance, estimated maximum impedance of a component, estimated maximum signal delay, estimated minimum on-current, estimated minimum off-current, estimated minimum leakage current, estimated minimum supply voltage droop, estimated minimum input impedance, estimated minimum output impedance, estimated minimum impedance of a component, and estimated minimum signal delay. Each of the above parameters can be calculated for the each of the multiplicate circuits based on design data.

In one embodiment, the multiplicate circuits can be configured to perform a same set of electrical functions with a variation in performance. For example, the variation can be selected from total power consumption, total leakage current, and a delay time for at least one signal.

In one embodiment, the multiplicate circuits can be configured to perform a same set of electrical functions at a same performance level under different environmental conditions. The same circuit reliability metric can include, but is not limited to, estimated variability in on-current, estimated variability in off-current, estimated variability in leakage current, estimated variability in supply voltage droop, estimated variability in input impedance, estimated variability in output impedance, estimated variability in an impedance of a component, and estimated variability in signal delay. Each of the above parameters can be calculated for the each of the multiplicate circuits based on design data.

In one embodiment, a variant circuit block may be configured to enhance at least one aspect of electrical performance of the original circuit block at the cost of reduction in performance in at least another aspect of electrical performance of the original circuit block. In another embodiment, a variant circuit block may be configured to enhance at least one aspect of electrical performance of the original circuit block at the cost of increasing a total area for the variant circuit block over the corresponding total area for the original circuit block. In yet another embodiment, a variant circuit block may be configured to reduce at least one aspect of electrical performance of the original circuit block while enhancing performance in at least another aspect of electrical performance of the original circuit block. In still another embodiment, a variant circuit block may be configured to reduce at least one aspect of electrical performance of the original circuit block while reducing a total area for the variant circuit block over the corresponding total area for the original circuit block.

In one embodiment, each of the multiplicate circuits can be designed to provide the same lifetime-related metric under a set of different environmental conditions. The same lifetime-related metric can include, but is not limited to, estimated time for electromigration failure under a set of operating conditions, an estimated time for thermal stress failure under a set of operating conditions, an estimated time for dielectric integrity failure under a set of operating conditions, an estimated time for leakage current failure under a set of operating conditions, and an estimated time for device speed failure under a set of operating conditions. Each of the above parameters can be calculated for the each of the multiplicate circuits based on design data.

The multiplicate circuits are added wherever any instance of the original circuit block is marked with a marker layer. If multiple types of circuit blocks are marked with a marker layer, each circuit block may be associated with a different set of multiplicate circuits. In other words, the set of multiplicate circuits that are added to an instance of a circuit block depends on the type of the circuit block. Thus, if N different types of original circuit blocks are marked with marker layers, up to N different sets of multiplicate circuits may be provided so that an i-th set of multiplicate circuits are added to each instance of an i-th circuit block. The number of multiplicate circuits in each set of multiplicate circuits may be the same or different across different sets of multiplicate circuits. The number of multiplicate circuits in a set of multiplicate circuits corresponding to a single original design shape may be typically from 2 to 1,000, and more typically from 2 to 10, although a greater number can also be employed. A second modified design is derived from the first modified design by adding corresponding multiplicate circuits to each marker layer at step 200.

Referring to step 300, a circuit simulation program having multiplicate layer handling capability is run for all regions in the second modified chip design layout. Each multiplicate circuit is successively selected to generate a modified circuit layout in which the corresponding circuit block of the original circuit layout is replaced with the selected multiplicate circuit. A circuit simulation is performed on each such modified circuit layout. The circuit simulation program having multiplicate layer handling capability can be configured to sequentially determine electrical parameter for each multiplicate circuit for any circuit block having a marked layer. The circuit simulation program having multiplicate layer handling capability can calculate effects of circuit blocks in located outside the selected circuit block. Alternately or in additionally, the circuit reliability simulation program having multiplicate layer handling capability can calculate effects of any relevant environmental variable such as operating temperature at the physical structure corresponding to the circuit block in a semiconductor chip. Further, the circuit simulation program having multiplicate layer handling capability can calculate effects of circuit blocks in located outside the selected circuit block. In one embodiment, the circuit simulation program having multiplicate layer handling capability can calculate effects of immediately neighboring circuit blocks around the selected circuit block.

Figure 4:
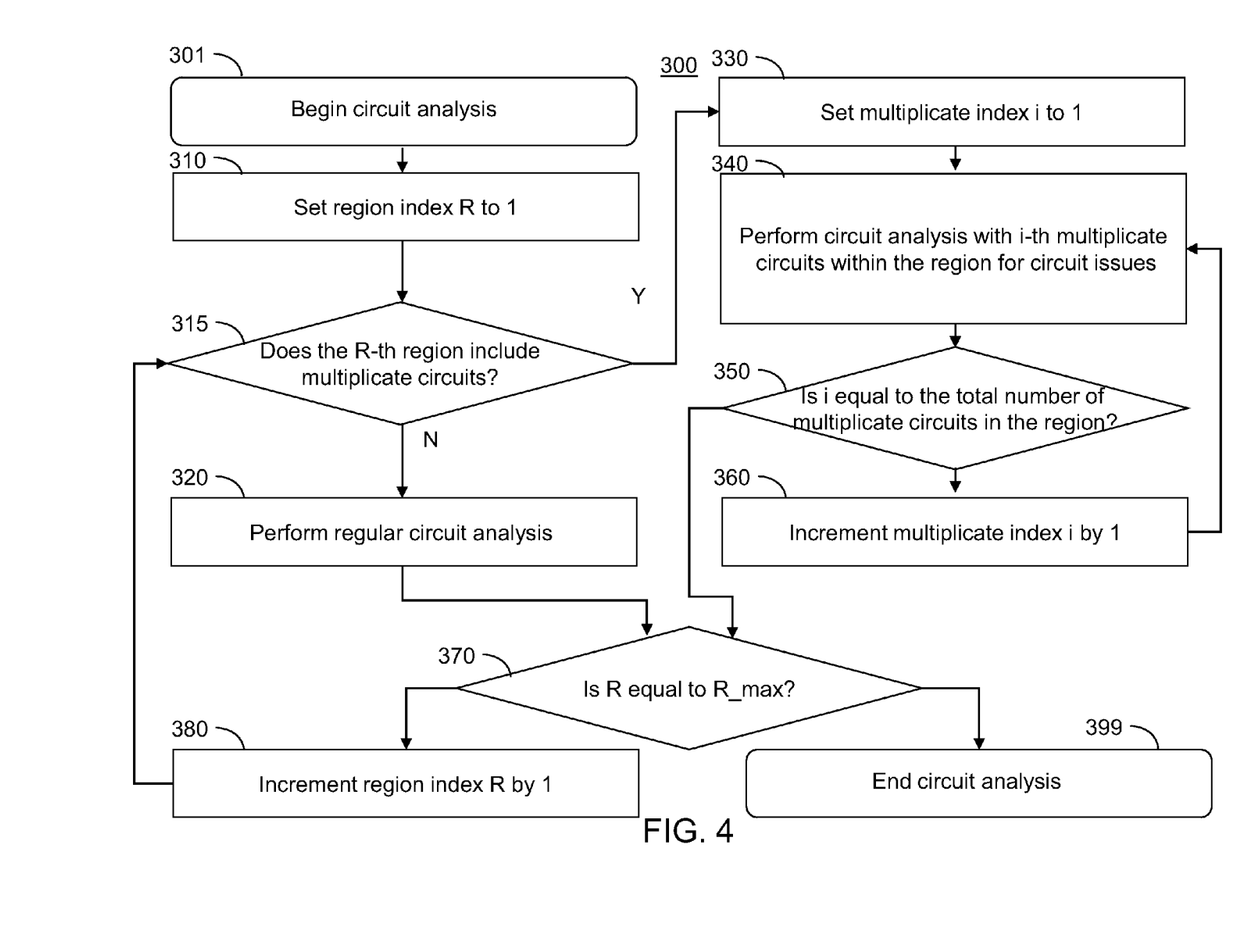
FIG. 4 is flow chart illustrating a method of performing multiplicate-layer-handling circuit simulation according to an embodiment of the present disclosure.

Referring to FIG. 4, a flow chart illustrates a sequence of steps that can be employed to perform step 300 in FIG. 3. Specifically, multiplicate-layer-handling circuit simulation can be performed employing the steps of the flow chart in FIG. 3 for each region including at least one circuit block in the second modified chip design layout. The steps in the flow chart of FIG. 3 can be performed by an automated system including at least one computing means such as at least one computer.

Referring to step 301, multiplicate-layer-handling circuit simulation begins. The chip design layout is divided into a number R of regions. Each of the marker layers is included in one of the number R of regions. Each of the number R of regions can include no marker layer, a single marker layer, or multiple marker layers. In one embodiment, each of the number R of regions can include none or only one of the marker layers.

Between step 310 and step 399, circuit simulations are successively performed on each region within the number R of regions. During electrical simulation of each region, all circuit blocks in the region are considered. In addition, immediately adjacent circuit blocks that neighbor the region can also be considered. Referring to step 310, a region index R for running an automated program for multiplicate-layer-handling circuit simulation on a computing means is set to 1.

Referring to step 315, an automated program running on the computing means determines whether the selected region, i.e., the region labeled with the current value of the region index R, includes any of the marked layers. The circuit simulation program having multiplicate layer handling capability may be subsequently run only if a selected region includes one or more of the marker layers.

If the selected region does not include any of the marker layers, step 320 is performed. At step 320, a normal circuit simulation program is run on the selected region, which includes only unmarked circuit blocks. The unmarked circuit blocks are identical to the circuit blocks as provided in the chip design layout at step 100 in FIG. 3 prior to generating any marked layers. Any circuit simulation program known in the art can be employed for the normal circuit simulation program.

The normal circuit simulation program checks the electrical operation, yield, and/or circuit reliability of the circuit block(s) in the selected region by calculating various circuit metrics, i.e., electrical performance metrics, yield metrics, and/or circuit reliability metrics, comparing the calculated circuit metrics with a set of predefined specification, and generating appropriate warning flags for the circuit metrics that do not meet the specification.

After step 320, step 370 is performed. At step 370, a determination is made on whether the region index R is equal to the maximum number for the region index R_max, which is the same as the total number of regions in the chip design layout as divided at step 310.

If the region index R is less than the maximum number for the region index R_max at step 370, step 380 is performed. At step 380, the region index R is incremented by 1. The process flow is directed to step 315 thereafter.

If the region index R is equal to the maximum number for the region index R_max at step 370, step 399 is performed.

The circuit performance metrics calculated from electrical simulations employing a multiplicate circuit at a time are saved in a non-transitory machine readable medium at step 399, and step 300 in FIG. 3 ends.

If the selected region includes any of the marker layers, steps 330, 340, and 350 are sequentially performed. A multiplicate index i is set to 1 at step 330. If the selected region includes a single instance of a circuit block that is marked with a marker layer, the multiplicate index i runs from 1 to the total number M of multiplicate shapes for the circuit block in steps 340, 350, and 360. If the selected region includes two or more instances of at least one circuit block, the numbers of multiplicate shapes $M_k$ for each of the two or more instances of at least one circuit block in the selected region are summed to calculate the maximum value M' for the multiplicate index. In other words, M'=$\Sigma M_k$, wherein the summation is performed over al instances of the at least one circuit block in the selected region. In both embodiments, each multiplicate shape in the selected region is assigned a unique multiplicate index between 1 and the maximum value.

Referring to step 340, a circuit simulation program having multiplicate layer handling capability is run on the selected region by making a single alteration to the chip design layout as originally provided. This alteration is the substitution of an instance of a marked circuit block with an instance of a multiplicate circuit that corresponds to the multiplicate index i. This, if the multiplicate index i has a value of j, the j-th multiplicate circuit among the M multiplicate circuits or M' multiplicate circuits substitutes the instance of the corresponding original circuit block. The corresponding original circuit block is previously marked with a marker layer at step 100 in FIG. 3, and the j-th multiplicate circuit is one of the multiplicate circuits that are added at step 200 in FIG. 3.

The circuit simulation is performed on an area including at least the selected region. In one embodiment, the circuit simulation can be performed on the selected region and neighboring regions that can affect circuit issue of devices in the selected region.

In one embodiment, the circuit simulation program having multiplicate layer handling capability calculates effects of other circuits located outside a selected marker layer upon the electrical performance metric, yield metric, and/or circuit reliability metric of each multiplicate circuit within the selected marker layer. The effects of other circuits are quantified as a set of calculated circuit metrics.

In one embodiment, the set of calculated circuit metrics can factor in the effects of environmental conditions that each marked circuit block is placed in. The environmental conditions can include, but are not limited to, ambient temperature, power supply voltages applied to the marked circuit block, and the leakage current associated with the power supply applied to the marked circuit block.

Further, the circuit simulation program having multiplicate layer handling capability can calculate at least one electrical quantity for the selected instance of the circuit block. The at least one electrical quantity is at least one quantity derived from electrical simulation, i.e., an electrical-simulation-derived quantity.

In one embodiment, the at least one electrical-simulation-derived quantity can include, but is not limited to, an output drive current, an input impedance, power consumption, leakage current, signal delay of the selected circuit block. In another embodiment, the at least one electrical-simulation-derived quantity can include, but is not limited to, estimated power consumption, estimated leakage current, and an estimated delay time for at least one signal in the selected circuit block. The at least one electrical-simulation-derived quantity may be employed to calculate the electrical performance metrics.

In one embodiment, the at least one circuit-reliability-simulation-derived quantity can include, but is not limited to, estimated nominal on-current, estimated nominal off-current, estimated nominal leakage current, estimated nominal supply voltage droop, estimated nominal input impedance, estimated nominal output impedance, estimated nominal impedance of a component, estimated nominal signal delay, estimated maximum on-current, estimated maximum off-current, estimated maximum leakage current, estimated maximum supply voltage droop, estimated maximum input impedance, estimated maximum output impedance, estimated maximum impedance of a component, estimated maximum signal delay, estimated minimum on-current, estimated minimum off-current, estimated minimum leakage current, estimated minimum supply voltage droop, estimated minimum input impedance, estimated minimum output impedance, estimated minimum impedance of a component, and estimated minimum signal delay. Each of the above parameters can be calculated for the each of the multiplicate circuits by running the circuit reliability simulation program having multiplicate layer handling capability.

In one embodiment, the at least one circuit-reliability-simulation-derived quantity can include, but is not limited to, estimated variability in on-current, estimated variability in off-current, estimated variability in leakage current, estimated variability in supply voltage droop, estimated variability in input impedance, estimated variability in output impedance, estimated variability in an impedance of a component, and estimated variability in signal delay. Each of the above parameters can be calculated for the each of the multiplicate circuits by running the circuit reliability simulation program having multiplicate layer handling capability.

In one embodiment, the at least one circuit-reliability-simulation-derived quantity can include, but is not limited to, estimated time for electromigration failure under a set of operating conditions, an estimated time for thermal stress failure under a set of operating conditions, an estimated time for dielectric integrity failure under a set of operating conditions, an estimated time for leakage current failure under a set of operating conditions, and an estimated time for device speed failure under a set of operating conditions. Each of the above parameters can be calculated for the each of the multiplicate circuits by running the circuit reliability simulation program having multiplicate layer handling capability.

Each of the at least one circuit-reliability-simulation-derived quantity may be employed to calculate the circuit reliability metrics.

Referring to step 350, a determination is made on whether the multiplicate index i is equal to the maximum number for the multiplicate index i, which is M or M' depending on embodiments.

If the multiplicate index i is less than the maximum number for the multiplicate index i, step 360 is performed. At step 360, the multiplicate index is incremented by 1. The process flow is directed to step 340 thereafter. By looping through steps 340, 350, and 360, circuit simulation is performed for all multiplicate circuits in the selected region.

If the multiplicate index i is equal to the maximum number for the multiplicate index i for the selected region, the process flow is directed to step 370.

During the steps of the flow chart in FIG. 3, at least one circuit simulation is performed for each circuit block in the original chip design layout. Multiple circuit simulations are performed for each marked circuit block in which each circuit simulation employs a multiplicate circuit corresponding to a selected circuit block.

Referring to step 400, circuit performance metrics for a set of multiplicate layers corresponding to each marked circuit block are compared. The performance metric that is employed to select one of the multiplicate circuits for each original circuit block can be any of the circuit performance metrics known in the art, or any combination thereof that interrelates multiple circuit performance metrics through a mathematical formula and/or a logical combination. For example, multiple circuit performance metrics can be combined with a weighting system that adds points for superior performance above target and/or subtracts points for inferior performance below target.

In one embodiment, the various circuit performance metrics can be mathematically and/or logically combined to calculate a single scalar quantity that is herein referred to a circuit performance metric scalar. In this embodiment, a multiplicate circuit that scores a best performance metric can selected by comparing the circuit performance metric scalars for the multiplicate circuits associated with the corresponding original circuit block.

The second modified chip design layout is updated to replace the corresponding original circuit block with the multiplicate circuit that scores the best performance metric. The second modified circuit layout after at least one update with the replacement of an original block with a multiplicate circuit scoring the best performance metric is herein referred to as a third modified circuit layout. If a set of at least one multiplicate circuit replaces every marked circuit block in a marker layer, the marker layer can be deleted in the third modified circuit layout.

The replacement of each marked circuit block with a multiplicate circuit that scores the best performance metric among the multiplicate circuits associated with the marked circuit block can be done for every marker layer to complete the revision to the third modified chip design layout.

The data representing the third modified chip design layout is stored in a non-transitory machine readable storage medium by encoding the data in the non-transitory machine readable storage medium employing data encoding methods known in the art. In one embodiment, the encoded data can be stored in a form of a netlist or in a data format used for the exchange of layout data of integrated circuits.

Referring to step 500, a set of at least one mark can be manufactured employing a final version of the third modified chip design layout. The set of at least one mark can be can be manufactured, for example, by transmitting the data representing the third modified chip design layout and stored in a non-transitory machine readable medium to a mask writer by electronic means or by physical transfer of the non-transitory machine readable medium to a device electrically connected to the mask writer and configured to read the data in the non-transitory machine readable medium.

Figure 5:
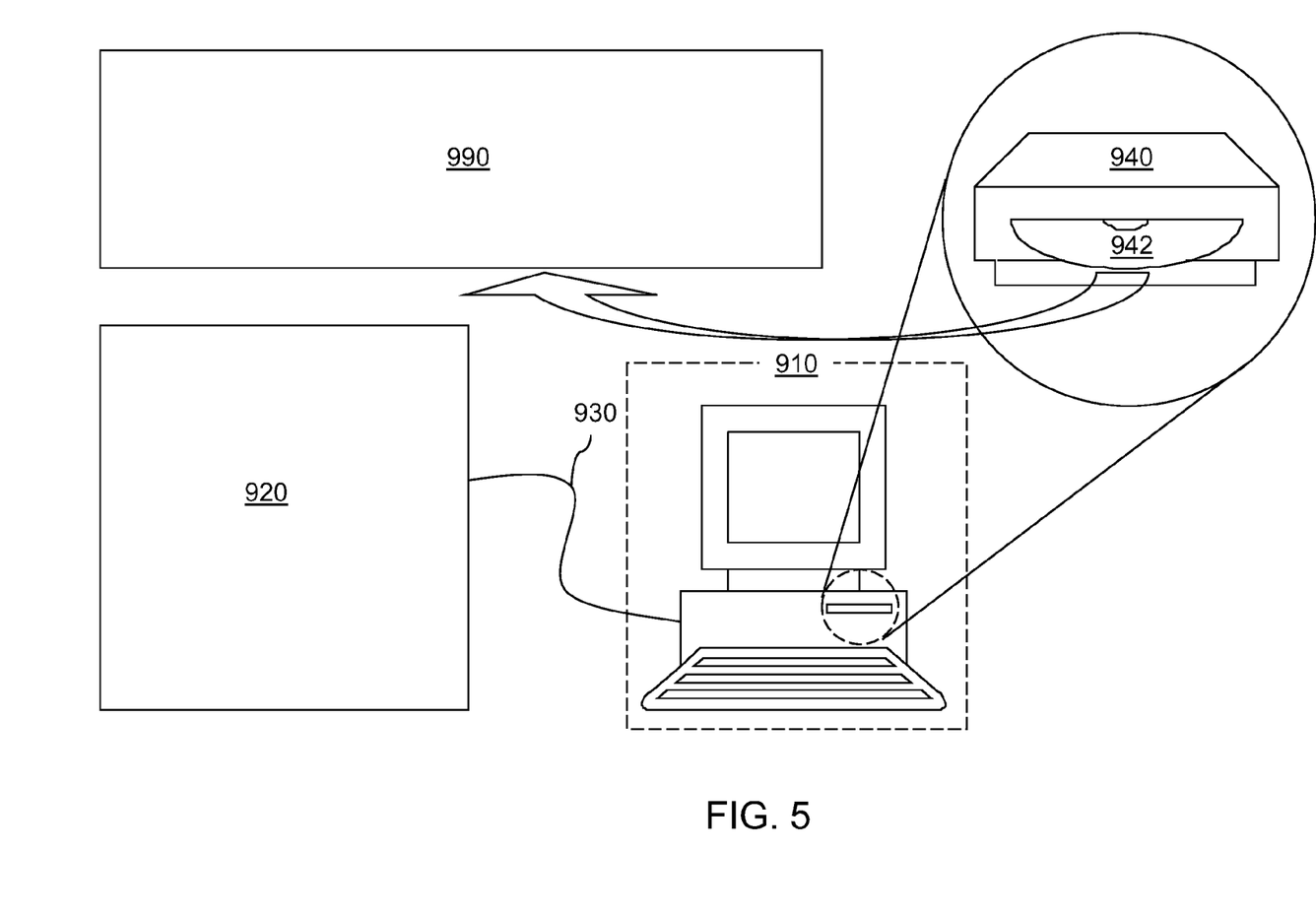
FIG. 5 is a view of an exemplary system for optimizing a chip design layout employing multiplicate-layer-handling circuit simulation according to an embodiment of the present disclosure.

Referring to FIG. 5, a system can be provided for manufacturing a set of at least one lithographic mask in which a chip design layout is optimized employing multiplicate-layer-handling circuit simulation. The system can include at least one computing means 910, which can include a computer. The at least one computing means 910 can be in communication with a database 920, which can be a standalone computing means or can be incorporated into the at least one computing means 910. If the database 920 is a standalone computing means, a data cable 930 or wireless communication can be employed to transfer data between the database 920 and the at least one computing means 910.

The at least one computing means 910 can be employed to perform at least one or all of steps 100, 200, 300, and 400 in FIG. 3 to modify a chip design layout. The at least one computing means 910 can be configured to perform the various steps in FIG. 3 automatically without human intervention once a chip design layout is provided. The first modified chip design layout, the second modified chip design layout, the third modified chip design layout, and/or any intermediate modified chip design layout can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable encoding of the data representing any of the data employed during the various steps in FIG. 3.

The final version of the third modified chip design layout is transferred to a mask writing device 990 to enable manufacturing of a set of at least one lithographic mask (reticle) encoding the final version of the third modified chip design layout. The data transfer to the mask writing device 990 can be effected by a portable non-transitory machine-readable data storage medium 942, a data cable (not shown) or by wireless communication.

The various data employed in the method of the present disclosure, including the first modified chip design layout, the second modified chip design layout, the third modified chip design layout, and/or any intermediate modified chip design layout, can be in any data format used for the exchange of layout data of integrated circuits and/or symbolic data format (e.g. information stored in a GDSII (GDS2), GL1, OASIS, map files, or any other suitable format for storing such design data structures). The various data may comprise information such as, for example, symbolic data, map files, test data files, design content files, layout parameters, and any other data required by a reticle manufacturer to manufacture a set of at least one reticle encoding the third modified chip design layout.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method for modifying a chip design layout, said method comprising:
   marking, in a chip design layout, regions associated with an instance of a circuit block with marker layers;
   adding multiplicate circuits to each instance of said circuit block in said marker layers in said chip design layout;
   performing circuit simulations for each marker layer in said chip design layout by running a circuit simulation program having multiplicate layer handling capability, wherein each of said multiplicate circuits is successively employed to perform circuit simulations for each instance of said circuit block in said marker layers;
   calculating a circuit metric for each of said circuit simulations; generating a modified chip design layout by selecting, for each marker layer, a multiplicate circuit that maximizes said circuit metric; and
   storing data representing said modified chip design layout in a non-transitory machine readable storage medium by encoding said data therein.

2. The method of claim 1, wherein said multiplicate circuits differ among one another in at least one design shape.

3. The method of claim 1, wherein each of said multiplicate circuits performs a same set of electrical functions with a variation in performance, wherein said variation is selected from total power consumption, total leakage current, and a delay time for at least one signal.

4. The method of claim 1, wherein said multiplicate circuits perform a same set of electrical functions at a same performance level under a set of different environmental conditions, said set of different environments including at least one of different operating temperatures, different thermal stress, different power supply voltage, and different pattern density in surrounding circuits.

5. The method of claim 1, further comprising determining whether a selected region for each circuit simulation includes any of said marker layers.

6. The method of claim 5, further comprising:
   running a normal circuit simulation program on an instance of said circuit block in said selected region if said selected region does not include any of said marker layers; and
   running said circuit simulation program having multiplicate layer handling capability on said selected region if said selected region includes any of said marker layers.

7. The method of claim 1, further comprising:
   dividing said chip design layout into a number R of regions, wherein each of said marker layers is included in one of said number R of regions; and
   successively performing a circuit simulation on each of said number R of regions, wherein said circuit simulation program having multiplicate layer handling capability is run only if a selected region includes one or more of said marker layers.

8. The method of claim 1, wherein said circuit metric includes at least one electrical-simulation-derived quantity selected from estimated power consumption, estimated leakage current, and an estimated delay time for at least one signal.

9. The method of claim 1, further comprising identifying said regions in said chip design layout employing an automated program that analyzes electrical characteristics of neighboring circuits around each instance of said circuit block in said chip design layout.

10. The method of claim 1, wherein said multiplicate circuits perform a same set of electrical functions with a same electrical performance metric under a set of different environments, said set of different environments including at least one of different ambient temperatures, different power supply voltages, and different leakage current.

11. The method of claim 1, wherein said circuit simulation program having multiplicate layer handling capability calculates at least one electrical quantity for a selected instance of said circuit block, said at least one electrical quantity selected from an output drive current, an input impedance, power consumption, leakage current, signal delay.

12. The method of claim 1, wherein said estimated circuit metric includes at least one circuit reliability-simulation-derived quantity selected from estimated nominal on-current, estimated nominal off-current, estimated nominal leakage current, estimated nominal supply voltage droop, estimated nominal input impedance, estimated nominal output impedance, estimated nominal impedance of a component, estimated nominal signal delay, estimated maximum on-current, estimated maximum off-current, estimated maximum leakage current, estimated maximum supply voltage droop, estimated maximum input impedance, estimated maximum output impedance, estimated maximum impedance of a component, estimated maximum signal delay, estimated minimum on-current, estimated minimum off-current, estimated minimum leakage current, estimated minimum supply voltage droop, estimated minimum input impedance, estimated minimum output impedance, estimated minimum impedance of a component, and estimated minimum signal delay.

13. The method of claim 1, wherein said estimated circuit metric includes at least one circuit reliability-simulation-derived quantity selected from estimated variability in on-current, estimated variability in off-current, estimated variability in leakage current, estimated variability in supply voltage droop, estimated variability in input impedance, estimated variability in output impedance, estimated variability in an impedance of a component, and estimated variability in signal delay.

14. The method of claim 1, wherein each of said multiplicate circuits provides a same lifetime-related metric under a set of different environmental conditions, wherein said same lifetime-related metric is selected from estimated time for electromigration failure under a set of operating conditions, an estimated time for thermal stress failure under a set of operating conditions, an estimated time for dielectric integrity failure under a set of operating conditions, an estimated time for leakage current failure under a set of operating conditions, and an estimated time for device speed failure under a set of operating conditions.

15. The method of claim 1, wherein said circuit simulation program having multiplicate layer handling capability calculates effects of other circuits located outside a selected marker layer upon said circuit metric of each multiplicate circuit within said selected marker layer.

16. The method of claim 1, wherein said steps of marking said regions, adding said multiplicate circuits, performing said circuit simulations, calculating said circuit metric, generating said modified chip design layout, and storing said data are performed by at least one computing means configured to perform said steps automatically.

17. The method of claim 1, wherein said data is stored in a form of a netlist or in a data format used for the exchange of layout data of integrated circuits.

18. A system for modifying a chip design layout, said system comprising at least one computing means and a non-transitory machine readable storage medium, wherein said at least one computing means is configured to perform the steps of:
marking, in a chip design layout, regions associated with an instance of a circuit block with marker layers;
adding multiplicate circuits to each instance of said circuit block in said marker layers in said chip design layout;
performing circuit simulations for each marker layer in said chip design layout by running a circuit simulation program having multiplicate layer handling capability, wherein each of said multiplicate circuits is successively employed to perform circuit simulations for each instance of said circuit block in said marker layers;
calculating a circuit metric for each of said circuit simulations; generating a modified chip design layout by selecting, for each marker layer, a multiplicate circuit that maximizes said circuit metric; and
storing data representing said modified chip design layout in a non-transitory machine readable storage medium by encoding said data therein.

19. The system of claim 18, wherein said multiplicate circuits differ among one another in at least one design shape.

20. The system of claim 18, wherein said at least one computing means is configured to perform a further step of determining whether a selected region for circuit simulation includes any of said marker layers.

21. The system of claim 20, wherein said at least one computing means is configured to perform further steps of:
running a normal circuit simulation program on an instance of said circuit block in said selected region if said selected region does not include any of said marker layers; and
running said circuit simulation program having multiplicate layer handling capability on said selected region if said selected region includes any of said marker layers.

22. The system of claim 18, wherein said at least one computing means is configured to perform further steps of:
dividing said chip design layout into a number R of regions, wherein each of said marker layers is included in one of said number R of regions;
successively performing a circuit simulation on each of said number R of regions, wherein said circuit simulation program having multiplicate layer handling capability is run only if a selected region includes one or more of said marker layers.

23. The system of claim 18, wherein said circuit metric includes at least one electrical-simulation-derived quantity selected from estimated power consumption, estimated leakage current, and an estimated delay time for at least one signal.

24. The system of claim 18, wherein said multiplicate circuits perform a same set of electrical functions at a same performance level under a set of different environments, said set of different environments including at least one of different operating temperatures, different thermal stress, different operating electrical current, and different pattern density in surrounding circuits.

25. The system of claim 18, wherein said circuit simulation program having multiplicate layer handling capability calculates effects of other circuits located outside a selected marker layer upon said circuit metric of each multiplicate circuit within said selected marker layer.

* * * * *